US005357142A

United States Patent [19]

Kubota et al.

[11] Patent Number: 5,357,142

[45] Date of Patent: Oct. 18, 1994

[54] ELECTRIC CONNECTION BOX WITH IGNITION SWITCH

[75] Inventors: Minoru Kubota; Yoshiaki Nakayama, both of Shizuoka, Japan

[73] Assignee: Yazaki Corporation, Tokyo, Japan

[21] Appl. No.: 60,963

[22] Filed: May 14, 1993

[30] Foreign Application Priority Data

May 19, 1992 [JP] Japan .............................. 4-032914[U]
Jun. 9, 1992 [JP] Japan .............................. 4-149325

[51] Int. Cl.[5] .............................. H05K 7/00

[52] U.S. Cl. .............................. 307/10.1; 361/629; 361/641

[58] Field of Search .............................. 200/5 A, 296, 308; 307/147, 148, 10.1, 10.6; 361/601, 622, 624, 626, 628, 629, 637, 641, 642-644, 648, 659, 736, 752, 824, 826-828, 833, 834

[56] References Cited

U.S. PATENT DOCUMENTS 4,349,861 9/1982 Zizza .............................. 361/347
4,887,263 1/1989 Steely .............................. 307/10.1
5,170,491 12/1992 Murata .............................. 455/73
5,179,503 1/1993 Fouts .............................. 307/10.1
5,194,756 3/1993 Darbesio .............................. 307/10.1

FOREIGN PATENT DOCUMENTS 245238 2/1990 Japan .

*Primary Examiner*—Gerald P. Tolin
*Attorney, Agent, or Firm*—Sughrue, Mion, Zinn, Macpeak & Seas

[57] ABSTRACT

Disclosed is an electric connection box integral with an ignition switch to be incorporated into an instrument panel in an automobile. The electric connection box, which is to be disposed in an instrument panel, includes in its internal circuit protect parts such as a fuse and the like and a branch circuit (a bus bar circuit) having circuits respectively to be connected directly with an ignition circuit, thereby connecting the ignition circuit directly with the branch circuit, whereby an ignition switch and the circuit protect parts are integrated into the electric connection box.

5 Claims, 9 Drawing Sheets

ELECTRIC CONNECTION BOX WITH IGNITION SWITCH

BACKGROUND OF THE INVENTION

1. Field of the Invention

The present invention relates to an electric connection box with an ignition switch to be installed to an instrumental panel in an automobile and, in particular, to an electric connection box which includes as ignition switch of an automobile integral therewith to thereby be able to save time and labor for wiring.

2. Description of the Prior Art

In the periphery of a driver's seat of an automobile, as shown in FIG. 9, there exist a large number of electric parts such as switches a, a unit b, an instrument board d with meters c incorporated therein, an ignition switch (which may also be hereinafter referred to as IGSW) and the like. For this reason, a large number of electric wires are necessary to connect them, which provides a tendency to enlarge and complicate a wire-harness W. In FIG. 9, reference character $W_0$ designates a main wire part of the wire-harness W, and w stands for a branch part of the wire-harness W. Also, f designates an electric connection box which is disposed in the bottom right-hand portion of the driver's seat, in which there are stored a branch circuit for absorbing a joint in the wire-harness as well as a fuse and a fusible link as circuit protect parts.

Also, as shown in FIGS. 10 and 11, a current power circuit is once connected to the electric connection box f from a main electric wire 1 connected to a battery g, and is then connected to the ignition switch e by means of an electric wire 1*a*. Here, it is divided into a power circuit (an electric wire 1*d*) relating to ignition and a power circuit (electric wires 1*b*, 1*c*) relating to accessory parts. Thereafter, the power circuits are again connected to the electric connection box f disposed in the bottom right-hand portion of the driver's seat and they are then distributed from the branch circuit 2, which is protected by fuses 3 in the electric connection box f, to the electric parts such as the respective switches a, instrument board d and the like by means of electric wires 4*a* to 4*d*.

Therefore, there are provided a large number of supply and return electric wires such as the electric wires 1*a* to 1*d* between the periphery of the instrument board d and electric connection box f, resulting in the enlarged and complicated wire-harness. In view of this, as disclosed in Japanese Unexamined Patent Publication No. Hei. 2-45238, there is also known a method in which the internal circuit of the instrument board d has a joint function. However, in this method as well, there are still left a large number of circuits which go and return between the above-mentioned electric connection box f and ignition switch e.

In FIG. 17, there is shown a block diagram of another conventional connecting structure in which an ignition switch is connected with an electric connection box in an vehicle.

In FIG. 17, reference character 140 designates an ignition switch, 141 stands for an electric connection box (a junction block) which is connected to the ignition switch 140 and also is used to energize the load sides 136 of respective electric parts to be mounted, 135 points out a power source fuse block which is connected to both of the ignition switch 140 and electric connection box 141, and 134 represents a battery.

Between the ignition switch 140 and electric connection box 141, there is interposed a wire harness 142 for electric power supply, which includes on circuits 142*a*, 142*c*, an accessory circuit 142*b*, a start circuit 142*d* and the like, to thereby connect the ignition switch 140 and electric connection box 141 to each other.

However, in the above-mentioned conventional structure, it takes much time and labor to arrange the power supply wire harness 142 for connecting the ignition switch 140 to the electric connection box 141 and to connect the wire harness 142 to its connector 143, which makes it troublesome to assemble them to the automobile.

Also, provision of the wire harness 142 results in complicated wirings round the driver's seat.

SUMMARY OF THE INVENTION

The invention aims at eliminating the drawbacks found in the above-mentioned conventional connecting structure. Accordingly, it is an object of the invention to provide an electric connection box with an ignition switch which reduces the number of electric wires to be provided round a driver's seat of an automobile and simplifies the structure of a wire harness to thereby be able to facilitate the production of the wire harness and also to greatly improve an assembling operation at the automobile manufacturer's side.

In achieving the above object, according to the invention, there is provided an electric connection box with an ignition switch to be installed into an instrument panel, wherein the electric connection box includes in the internal circuit thereof circuit protect parts such as a fuse and the like and a branch circuit having a circuit to be connected directly with an ignition circuit to thereby connect the ignition circuit directly with the branch circuit, whereby the ignition switch and circuit protect parts are integrated into the electric connection box.

That is, due to the fact the electric connection box, ignition switch and circuit protect parts are integrated into one, there is eliminated the need for electric wires which go an return between the electric connection box and ignition switch.

This reduces the number of electric wires to be provided round the driver's seat, which in turn simplifies the structure of the wire harness and thus improves greatly the production of the wire harness as well as an assembling operation at the automobile manufacture's side.

Accordingly, another object of the invention is to provide a structure which improves the arrangement of a power supply wire harness for connecting an ignition switch with an electric connection box and its connecting operationability and also which can prevent the complicated wirings.

In achieving the another object, according to the invention, there is provided an electric connection box integral with an ignition switch, in which an ignition circuit is provided on a circuit substrate contained within a main body of the electric connection box and an ignition switch having contacts respectively connectable with the ignition circuit is disposed within the connection box main body.

According to the invention, the contact of the ignition switch is connected with the circuit substrate within the connection box main body and thus the ignition switch can be connected with parts disposed at the load side by means of the circuit substrate. This eliminates the need for provision of a power supply wire harness which has been necessary in the conventional art, thereby avoiding the conventional troublesome and complicated wiring.

DETAILED DESCRIPTION OF THE PREFERRED EMBODIMENTS

Figure 1:
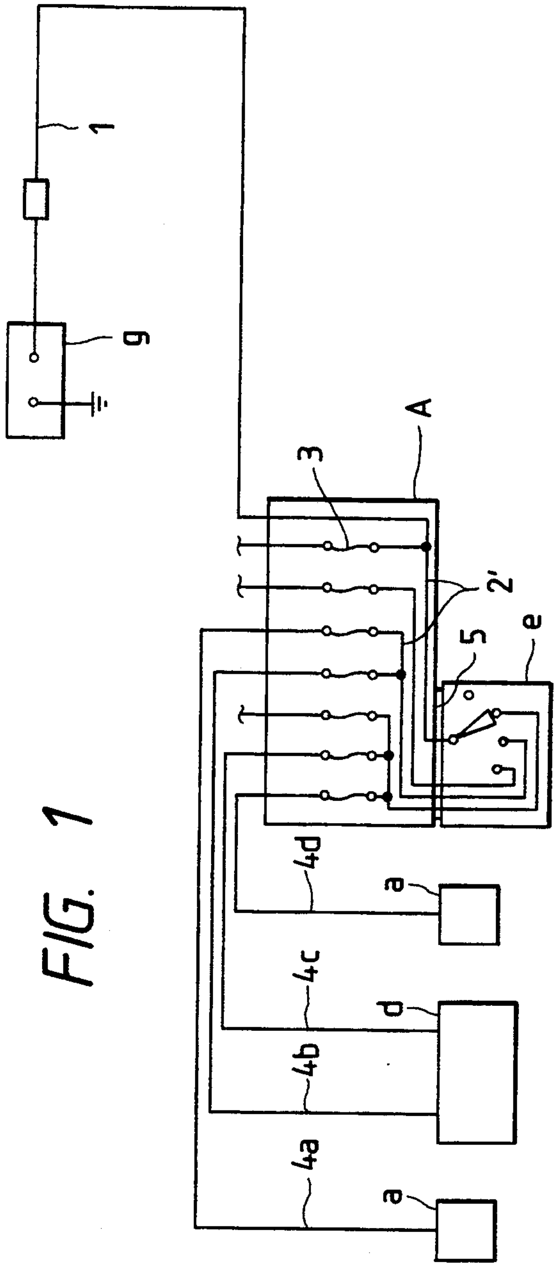
FIG. 1 is a wiring diagram of an instrument board and its periphery using an electric connection box with an ignition switch (IGSW) according to the invention.
Figure 2:
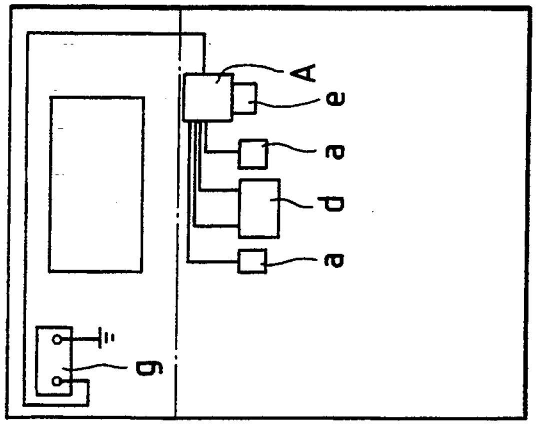
FIG. 2 is a block wiring diagram of an instrument board and its periphery using the electric connection box with an IGSW shown in FIG. 1 and an engine room.
Figure 3:
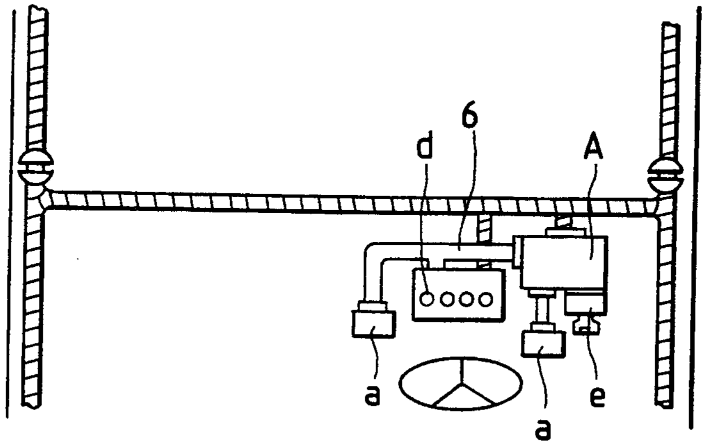
FIG. 3 is an explanatory view to show how to handle a wire harness in an instrument board and its periphery using the electric connection box with an IGSW.

In FIG. 1, there is shown a wiring diagram of an instrument board and its periphery using an electric connection box according to the invention, in FIG. 2, there is shown a block wiring diagram of the above, and in FIG. 3 there is shown an explanatory view to illustrate how to handle a wire harness employed in the above. In these figures, similar parts to those employed in the previously described conventional structure are given the same reference characters and the description thereof will be given below by use of the same reference characters.

Figure 10:
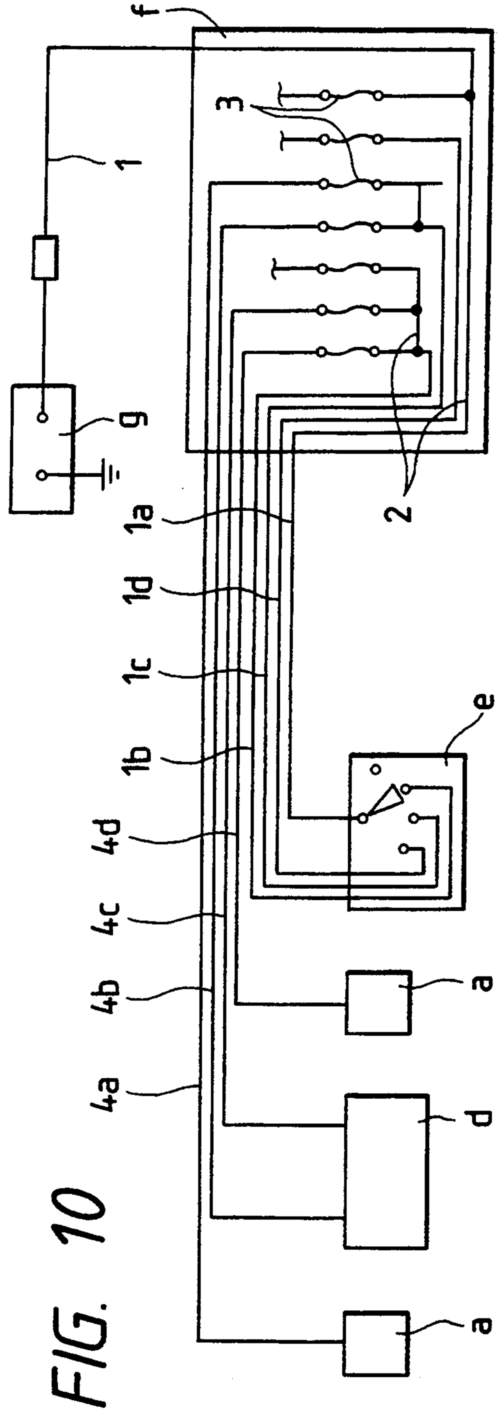
FIG. 10 is a wiring diagram of an IGSW and an instrument board and its periphery according to the conventional art.
Figure 11:
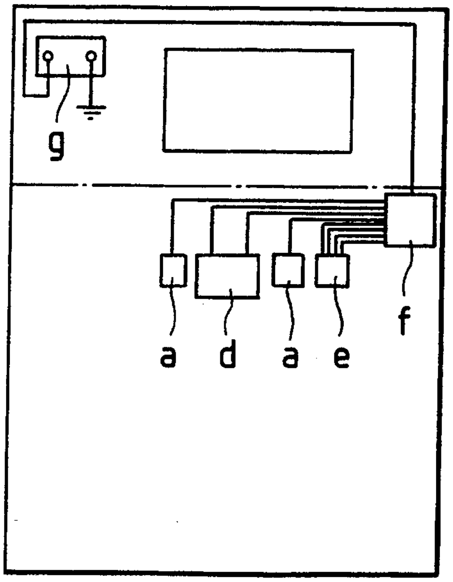
FIG. 11 is a block wiring diagram of an instrument board and its periphery including an IGSW and an engine room according to the conventional art.

In FIG. 1, seven fuses 3 in the electric connection box f shown in FIG. 10 and a bus bar circuit 2' protected by these fuses are incorporated in an electric connection box A and an ignition switch e is connected directly with the electric connection box A by a connector 5.

As can be clearly understood from the comparison of FIG. 1 with FIG. 10, according to the invention, there is eliminated the need for provision of four electric wires 1*a* to 1*d* respectively going and returning between the ignition switch e and the electric connection box f according to the conventional art. Also, as shown in FIG. 2, a power circuit for applying electricity to electric parts including a switch a disposed in the periphery of an instrument board d is supplied directly from the electric connection box A, which makes it possible to reduce four electric wires 4*a* in length. Further, by taking the branch functions of the respective signal circuits in the periphery of the instrument board into the electric connection box A, the electric connection box A can be connected with the peripheral parts such as the instrument board d, switches a and the like by a simple circuit such as a flat cable 6, as shown in FIG. 3.

As described above, according to the invention, the number of electric wires provided in the periphery of the instrument board can be reduced greatly and thus the arrangement form of the electric wires can be simplified.

Figure 4:
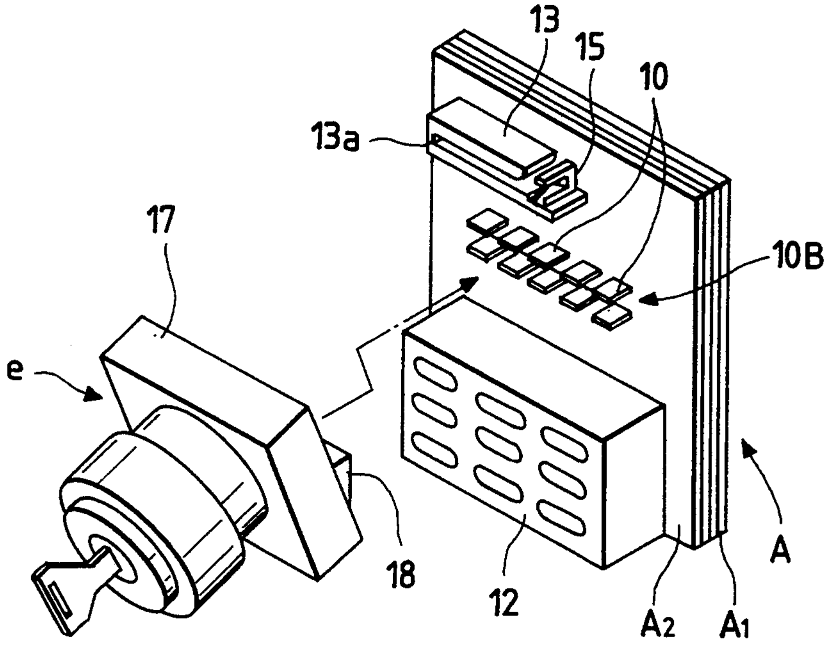
FIG. 4 is a perspective view of an embodiment of the electric connection box with an IGSW.
Figure 5:
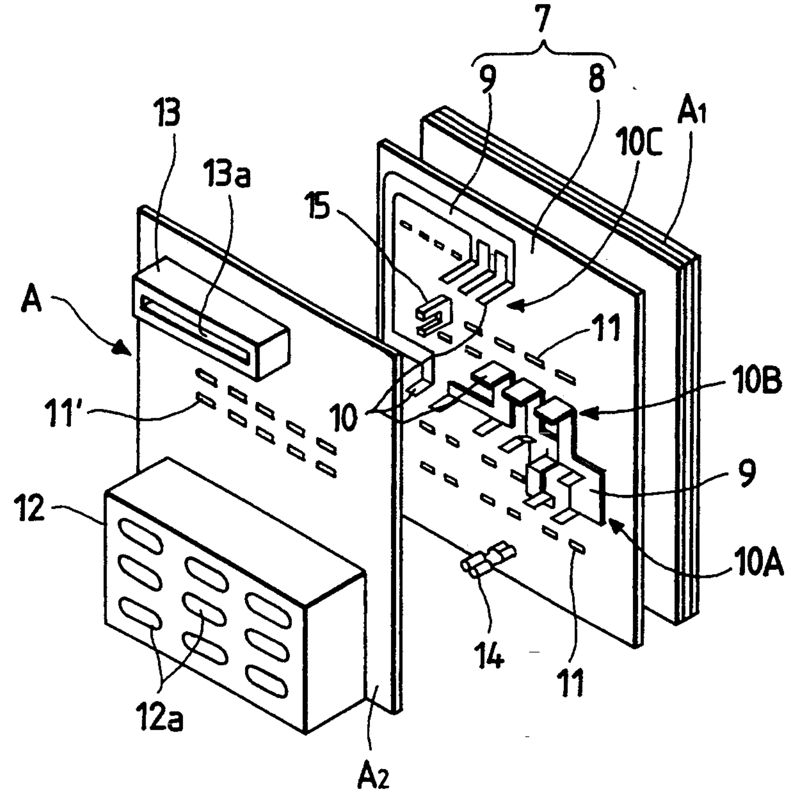
FIG. 5 is an exploded perspective view of the embodiment shown in FIG. 4.
Figure 6:
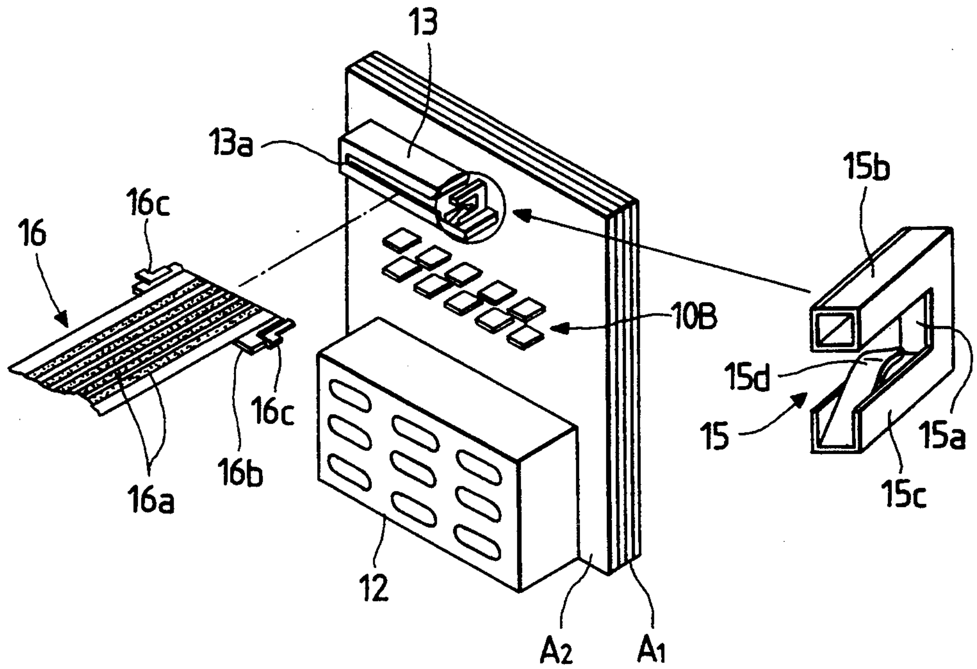
FIG. 6 is an explanatory view of a structure for connecting the electric connection box with the IGSW of FIG. 4 with an FPC.
Figure 7:
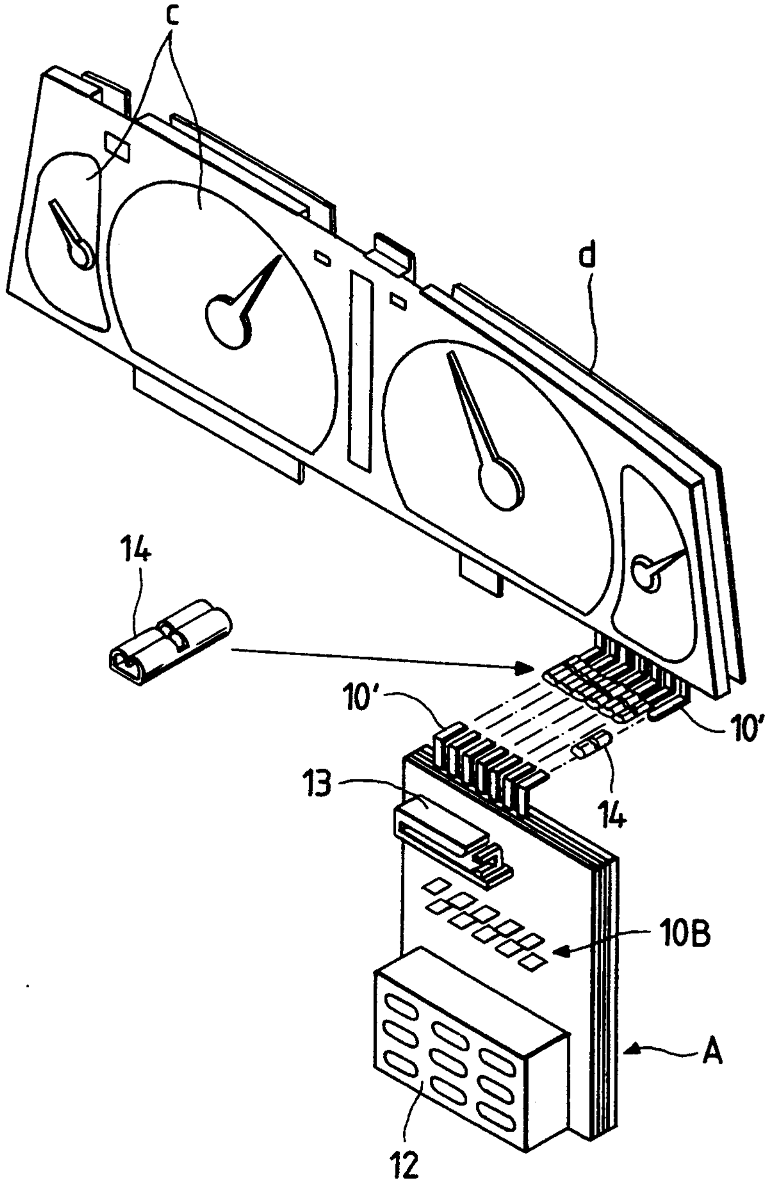
FIG. 7 is an explanatory view of a structure for connecting the electric connection box with an IGSW of FIG. 4 with an instrument board.

Now, FIG. 4 is a perspective view of an embodiment of an electric connection box having the above-mentioned internal circuit structure, FIG. 5 is an exploded perspective view of the above embodiment, FIG. 6 is an explanatory view of a connection structure for connecting the above electric connection box with an FPC, and FIG. 7 is an explanatory view of a connection structure for connecting the above electric connection box with an instrument board.

In these figures, an electric connection box A comprises a laminated circuit board $A_1$, which is formed by putting a plurality of bus bar circuit boards 7 one on another, and a cover $A_2$ for the laminated circuit board $A_1$, both of which are fixed together by known means such as a screw, a not or the like.

The bus bar circuit board 7 consists of an insulation substrate 8 and a plurality of bus bars 9 respectively stamped out into a desired pattern and laid on the insulation substrate 8. Tab-shaped connecting terminals 10 are projectingly provided on the end portion or middle portion of the bus bar 9. These connecting terminals are arranged collectively in several portions of the bus bar 9; for example, they are arranged as a fuse connecting terminals group 10A, an IGSW connecting terminals group 10B, and an FPC connecting terminals group 10C. Reference character 11 designates a terminal insertion hole formed in the insulation substrate 8. Here, on the bus bar circuit board 7, in addition to the above-mentioned fuse connecting terminals group 10A, IGSW connecting terminals group 10B and the like, there are also provided connecting circuits which are used to connect electric parts such as various kinds of meters and switches.

On the cover $A_2$, there are formed terminal insertion holes 11' for the IGSW connecting terminals group 10B and there are provided a fuse block 12 and an FPC connecting connector 13. The fuse block 12 includes a plurality of fuse cavities 12*a* for the above-mentioned fuses (see FIG. 1) and, within each of the cavities, there is stored a female-female relay terminal 14 one end of which is fitted into the connecting terminal 10 of the fuse connecting terminals group 10A. The FPC connecting connector 13 includes a slit-shaped FPC insertion opening 13*a* into which an FPC relay terminal 15 can be stored.

The FPC relay terminal 15, as shown in FIG. 6, includes a connecting base portion 15*a* having a U-shaped section, a square and hollow terminal receive portion 15*b* erected on one end of the connecting base portion 15*a*, and an electric contact portion 15*c* provided on the other end of the connecting base portion 15*a* and having a folded elastic contact piece 15*d*. If each connecting terminal 10 of the FPC connecting terminals group 10C is inserted into the terminal receive portion 15*b* from the base end side thereof and, for example, an FPC 16 extended from a composite switch a' (see FIG. 8) to be described later is inserted between the terminal receive portion 15*b* and electric contact portion 15*c* from the FPC insertion opening 13*a*, then the elastic contact piece 15*d* is brought into contact with a copper leaf circuit 16*a* of the FPC 16, so that the FPC relay terminal 15 is electrically connected with the FPC 16. 16*b* stands for a plate-shaped fixing member which holds the end portion of the FPC 16 in the folded state thereof. The fixing member 16*b* includes in the two sides thereof locking arms 16*c* which are engageable with the connecting connector 13.

Also, as shown in FIG. 4, the respective connecting terminals 10 of the IGSW connecting terminals group 10B are projected out through the terminal insertion holes 11' in the cover $A_2$ and, therefore, a connector 18 provided on a switch unit 17 of the ignition switch e can be connected with the connecting terminals group 10B with one touch.

The electric connection box A can also be connected to the instrument board d by other methods than the above-mentioned method using the FPC 16. That is, instead of using the FPC 16, for example, as shown in FIG. 7, in both the electric connection box A and instrument board d, there may be previously provided L-shaped connecting terminals groups 10' respectively and, after then these L-shaped connecting terminals groups 10' may be connected with each other by use of the female-female relay terminals 14 or the like, similarly to the previously described method.

Figure 8:
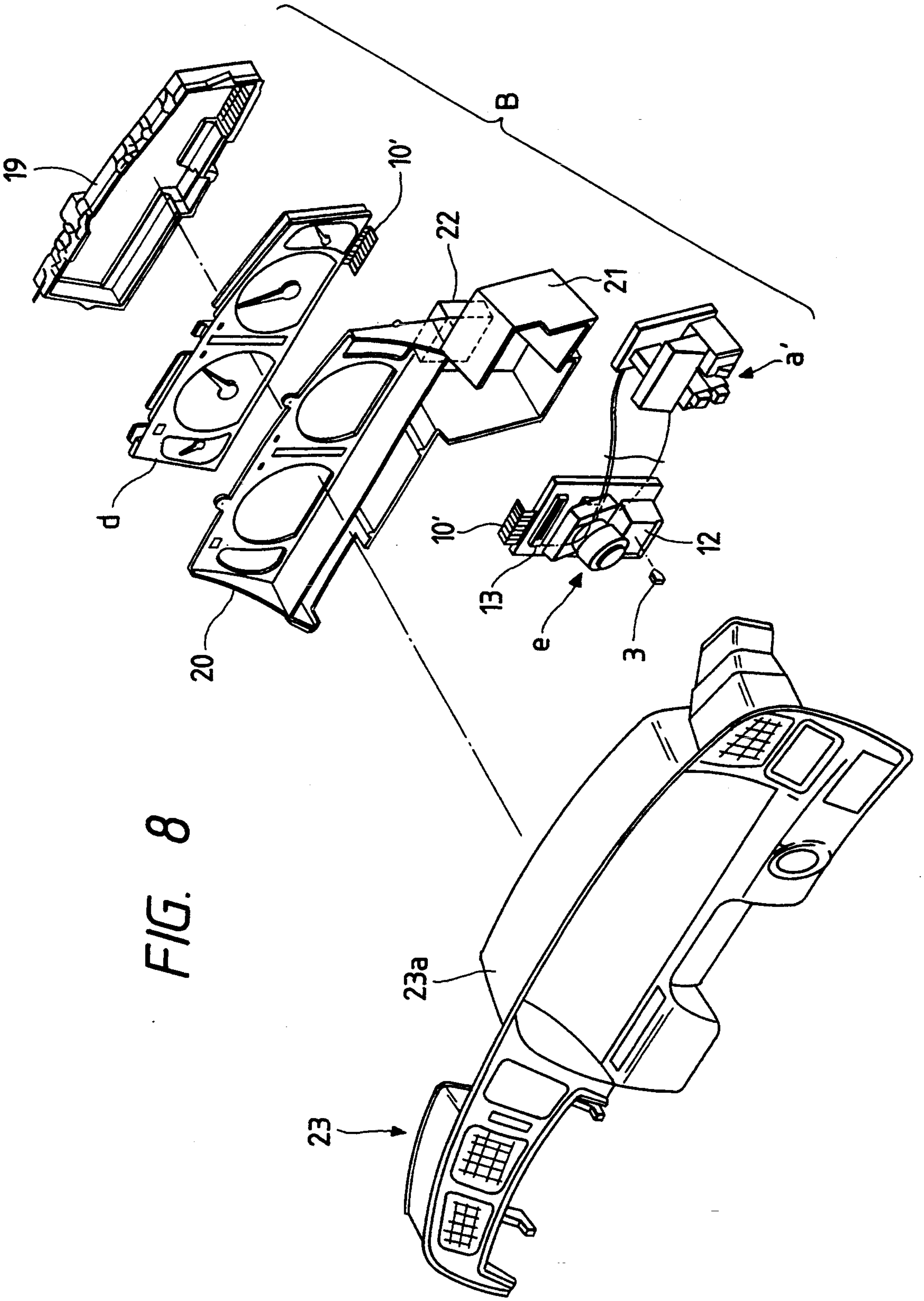
FIG. 8 is an exploded perspective view of a structure for assembling the electric connection box with an IGSW of FIG. 4 to an instrument panel.
Figure 9:
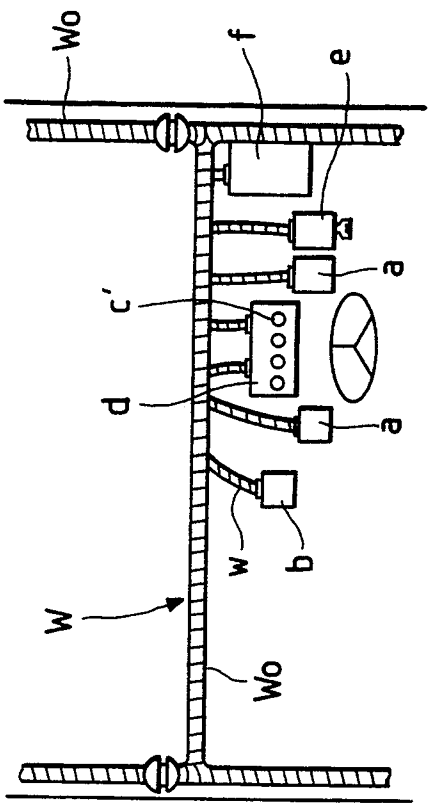
FIG. 9 is an explanatory view to show how to handle a wire harness in an instrument board and its periphery according to the conventional art.

Now, FIG. 8 shows an assembling structure for assembling the electric connection box A to an instrument panel.

In FIG. reference numeral 19 designates a case for the instrument board d and reference numeral 20 stands for a meter look-back board. Below one side portion of the look-back board 20, there is disposed a switch box 21 which has a multipolar connector housing 22. And, 23 designates an instrument panel.

According to the invention, after the instrument board d is set to the case 19 and the meter look-back board 20 is assembled and fixed from above the instrument board d by use of a screw (not shown), if the electric connection box A having a group switch a' connected thereto by the FPC 16 is mounted into the switch box 21 and is thus connected with the connector connecting terminals (not shown) of the multipolar connector housing 22 for wire harness connection, then there can be provided an assembly B which consists of the electric connection box A, instrument board d and group switch a' assembled integrally to one another.

The assembly B can be assembled to a cluster finish 23*a* of the instrument panel 23 with the one touch thereof and, therefore, at the automobile manufacturer's side, there can be eliminated the need for provision of electric wires between the instrument board d, ignition switch e, group switch a' and electric connection box f (see FIG. 10).

Next, description will be give below in detail of another embodiment of an electric connection box integral with an ignition switch according to the invention with reference to FIGS. 12 to 16.

Figure 12:
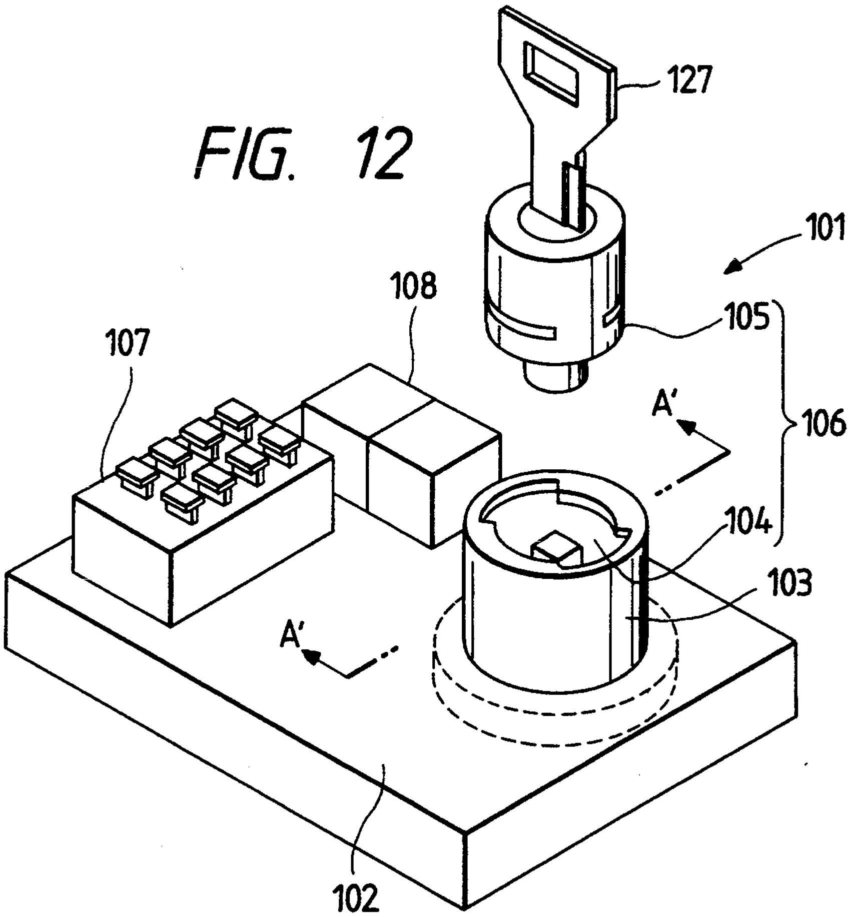
FIG. 12 is an exploded perspective view (an appearance view) of another embodiment of an electric connection box integral with an ignition switch according to the invention.
Figure 13:
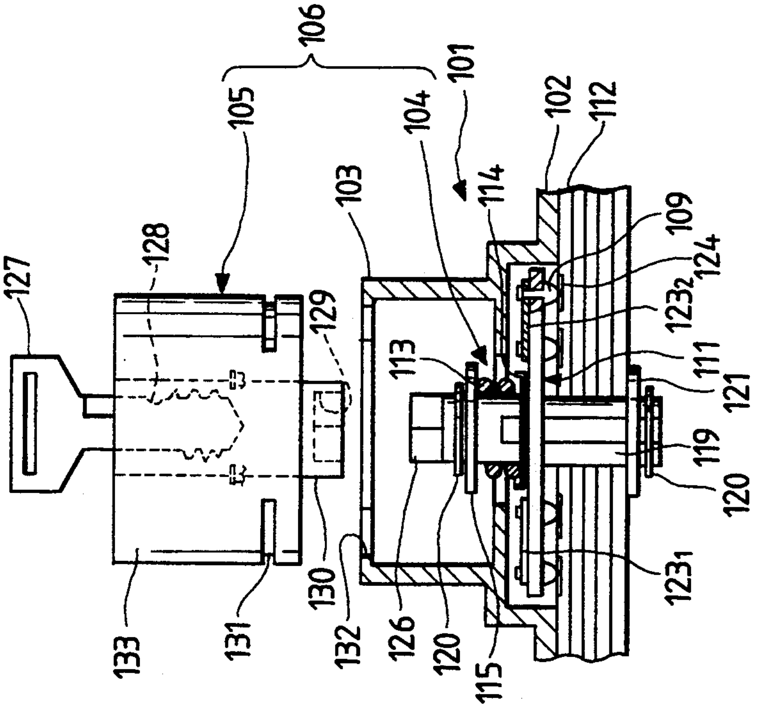
FIG. 13 is a section view taken along the line A'—A' in FIG. 12.

FIG. 12 is an appearance view of an embodiment of an electric connection box integral with an ignition switch according to the invention, and FIG. 13 is a section view taken along the line A'—A' shown in FIG. 12.

That is, the present electric connection box 101 is characterized in that it includes a connection box main body 102 formed of synthetic resin, a cylindrical ignition switch storage part 103 is formed integrally with the connection box main body 102, a rotary switch portion 104 of an ignition switch 106 is disposed within the storage part 103, and a key cylinder part 105 is disposed opposed to the switch part 104 in such a manner that they can be connected with each other.

The present electric connection box 101 includes, in addition to the above parts, a fuse block 107, a relay 108 and electronic parts (such as a diode, a capacitor and the like which are not shown) which are provided integrally therewith.

Figure 14:
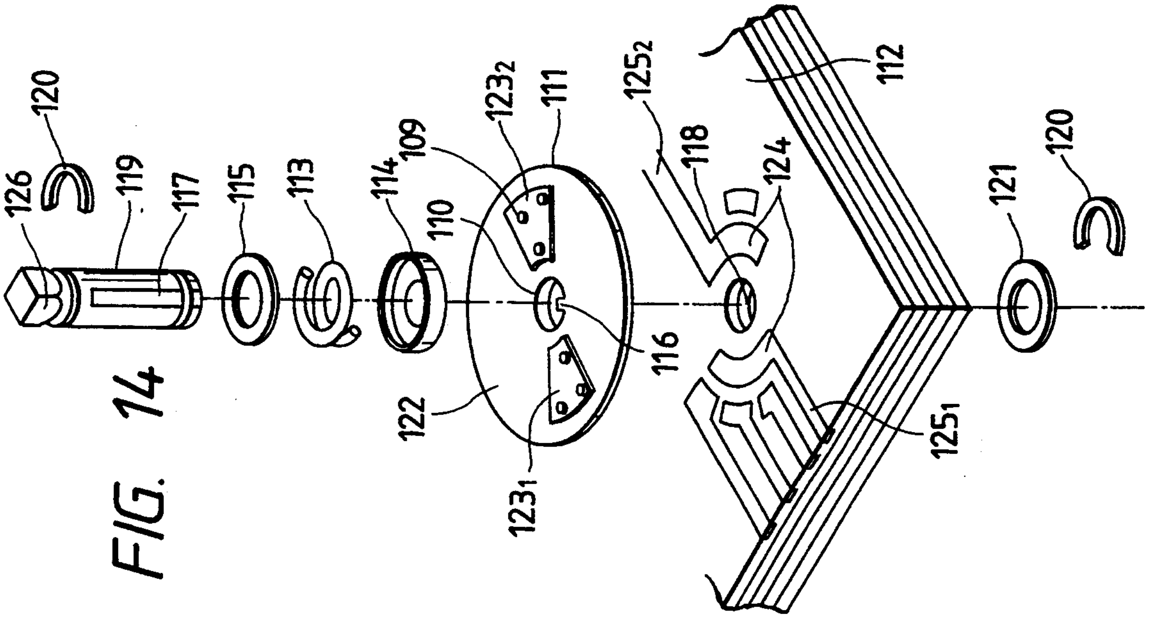
FIG. 14 is an exploded perspective view of a structure of a switch portion of the embodiment shown in FIG. 12.

The rotary switch part 104 of the ignition switch 106, as shown in FIG. 14 which is an exploded view thereof, a switch plate 111 having projecting electric contacts 109 and a central hole 110, a coil spring 113 pushing the switch plate 111 against a circuit substrate 112 disposed within the connection box main body 102, a receive plate 114 and a washer 115 respectively disposed above and below the coil spring 113, a rotary shaft 119 which extends through these parts to engage a key portion 116 of the switch plate 111 with a key groove 117 and is inserted into a shaft hole 118 formed in and extending through the circuit substrate 112, and upper and lower retaining rings 120, 120 and a washer 121 which are used to secure the rotary shaft 119.

The switch plate 111 includes an insulating disk 122, a pair of fan-shaped conduction plates $\mathbf{123_1}$, $\mathbf{123_2}$ respectively bonded right and left symmetrically onto the disk 122, and the above-mentioned contact 109 which are projectingly provided on the three positions of each of the conduction plates $\mathbf{123_1}$, $\mathbf{123_2}$. Additionally, the circuit substrate 112, which is disposed opposed to the switch plate 111, includes and arc-shaped ignition circuit 124 which corresponds to the contacts 109. The ignition circuit 124 is formed integrally in a bus bar circuit 125, $\mathbf{125_1}$, $\mathbf{125_2}$, constituting a portion of a power supply circuit which is connected to electric parts (not shown) and the like.

Also, the rotary shaft 119 includes in the leading end portion thereof a rectangular connecting portion 126 to which the key cylinder part 105 can be connected.

The key cylinder part 105 (FIG. 13) comprises a rotary shaft portion 130, which includes in one portion thereof an insertion hole 128 for an ignition key 127 and in the other portion thereof a fit hole 129 for the connecting portion 126, and a cover member 133 which supports the rotary shaft portion 130 and also secures a groove 131 formed in the outer peripheral wall thereof to a flange 132 provided in the above-mentioned cylindrical part 103.

Figure 15:
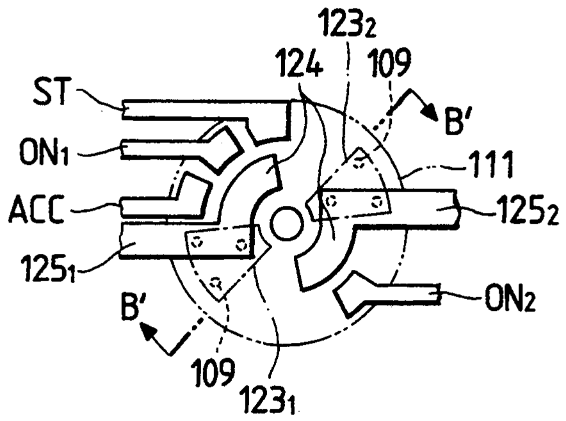
FIG. 15 is an explanatory view of a circuit connection state of the above switch portion.

In FIG. 15, there is shown a method in which the switch plate 111 is rotated into connection with the ignition circuit 124. In particular, by rotating the switch plate 111 stepwise in a direction of an arrow B from its switch-off state, at first, at a first step, the contacts 109 of one conduction plate $123_1$ connect a power supply (bus bar) circuit $125_1$ with an accessory circuit ACC, next at a second step, connect the accessory circuit ACC with an on circuit $ON_1$, and further at a third step connect the on circuit $ON_1$ with a start circuit ST, and at the same time, the contacts 109 of the other conduction plate $123_2$ connect a power supply circuit $125_2$ with an on circuit $ON_2$, so that an engine can be started.

Figure 16:
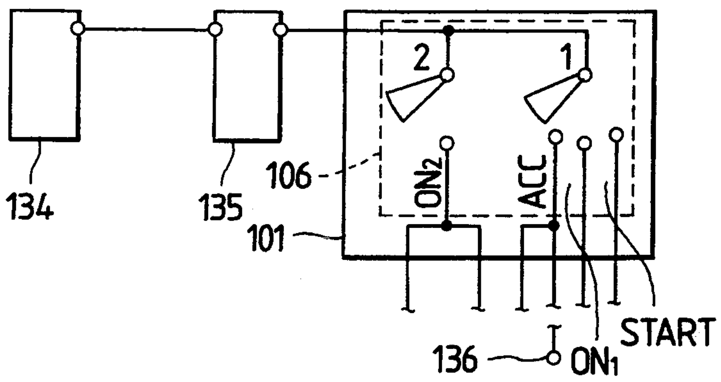
FIG. 16 is an explanatory view of a connection state of an electric connection box integral with an ignition switch according to the invention; and, FIG. 17 is a circuit diagram of a connection state between an ignition switch and an electric connection box according to the conventional art.
Figure 17:
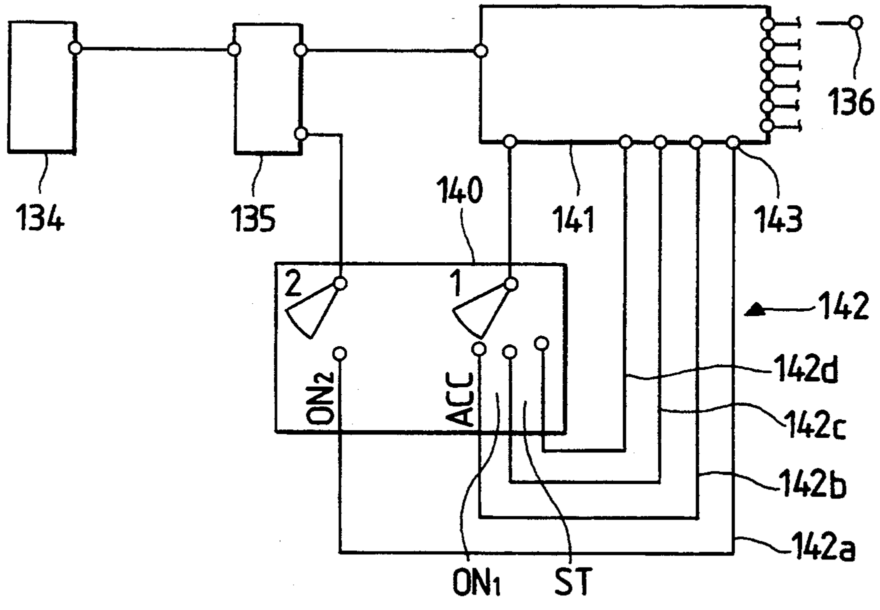

In FIG. 16, there is shown a circuit connection state of the above-mentioned electric connection box integral with an ignition switch. A circuit, which starts from a battery 134 and passes through a power source fuse block 135, is connected directly with an electric connection box 101, so that electricity is supplied to an ignition switch 106 disposed within the connection box 101. And, electricity is supplied from the electric connection box 101 to the respective loads 136 of electric parts and the like. Therefore, this structure eliminates the need for provision of a power supply wire harness 142 for connecting an ignition switch 140 with an electric connection box 141 which is required in the conventional art structure as shown in FIG. 17, thereby avoiding such troublesome and complicated wiring as in the conventional structure.

As has been heretofore described, in the electric connection box with an IGSDW according to the invention, the internal circuit of the electric connection box to be disposed in an instrument panel includes therein circuit protect parts such as a fuse and the like and a branch circuit having circuits respectively to be connected directly with an ignition circuit to thereby connect the ignition circuit directly with the branch circuit. This provides a structure in which the ignition switch and circuit protect parts are integrated into a conventional electric connection box. Thanks to this structure, the present invention can reduce the number of electric wires to be arranged round a driver's seat and also can simplify the structure of a wire harness, which in turn can improve the production of the wire harness and an assembling operation at an automobile manufacturer's side.

As can be clearly understood from the foregoing description, according to the invention, due to the fact that there is eliminated the need for the complicated wire harness connection between the ignition switch and electric connection box, the present electric connection box makes it easy to assemble itself to an automobile and also can avoid complicated wiring round the driver's seat of the automobile.

What is claimed is:

1. An electrical connection box which electrically connects a battery to an electrical accessory in a vehicle, the combination comprising:

a connection box housing attachable to a body of said vehicle;

a bus bar circuit provided in said housing and including a plurality of conductive paths, one of said paths being electrically connected to said battery;

a fuse circuit provided in said housing and being electrically connected to another one of said conductive paths and to said electrical accessory;

an ignition switch unit secured to said housing and including an electrical switch which is electrically connected to said bus bar circuit in such a manner as to selectively interconnect said one path to said another path.

2. The electrical connection box of claim 1, wherein said ignition switch unit is integral to said housing.

3. The electrical connection box of claim 2, wherein said ignition switch unit and said housing are a one-piece construction.

4. The electrical connection box of claim 1, wherein said electrical accessory includes a plurality of meters and switches.

5. The electrical connection box of claim 1, wherein said ignition switch unit is detachably secured to said housing.

* * * * *